United States Patent
Fan et al.

(10) Patent No.: US 8,178,447 B1
(45) Date of Patent: May 15, 2012

(54) METHODS OF FORMING HYDROPHOBIC SILICON DIOXIDE LAYER AND FORMING ORGANIC THIN FILM TRANSISTOR

(75) Inventors: Ching-Lin Fan, Keelung (TW);
Ping-Cheng Chiu, Tainan (TW);
Chang-Chih Lin, Taoyuan County (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 13/006,424

(22) Filed: Jan. 14, 2011

(30) Foreign Application Priority Data

Nov. 29, 2010 (TW) ................................ 99141265 A

(51) Int. Cl.
*H01L 21/31* (2006.01)
(52) U.S. Cl. .................... 438/789; 257/E21.24; 427/452
(58) Field of Classification Search .................. 427/452; 438/99, 158, 789; 257/E21.24
See application file for complete search history.

(56) References Cited

OTHER PUBLICATIONS

Ching-Lin Fan, Ping-Cheng Chiu, Yan-Hang Yang and Chang-Chih Lin. Low-temperature-processed (<100° C) organic thin-film transistor using hollow-cathode CVD SiO2 as the gate insulator. Jun. 11, 2010. Semicond. Sci. Technol. 25 075006.*
Shashank C. Deshmukh and Eray S. Aydil. Investigation of low temperature SiO2 plasma enhanced chamical vapor deposition. Mar. 1996. J. Vac. Sci. Technol. B 14(2) p. 738-743.*

* cited by examiner

*Primary Examiner* — William D Coleman
*Assistant Examiner* — Daniel Shook
(74) *Attorney, Agent, or Firm* — Jianq Chyun IP Office

(57) ABSTRACT

A method of forming a hydrophobic silicon dioxide layer is provided. A substrate is provided. Thereafter, a hydrophobic silicon dioxide layer is formed on the substrate by using a plasma chemical vapor deposition (CVD) system, in which tetraethyl orthosilicate (TEOS) and an oxygen-containing gas are introduced at a reactive temperature between 25° C. and 150° C. A method of forming an organic thin film transistor (OTFT) including the hydrophobic silicon dioxide layer as a gate insulating layer is also provided. In the present invention, the hydrophobic silicon dioxide layer can be directly formed at low temperature without using the conventional surface modification treatment. Accordingly, the process is simplified and the cost is reduced.

10 Claims, 2 Drawing Sheets

METHODS OF FORMING HYDROPHOBIC SILICON DIOXIDE LAYER AND FORMING ORGANIC THIN FILM TRANSISTOR

CROSS-REFERENCE TO RELATED APPLICATION

This application claims the priority benefit of Taiwan application serial no. 99141265, filed on Nov. 29, 2010. The entirety of the above-mentioned patent application is hereby incorporated by reference herein and made a part of specification.

BACKGROUND OF THE INVENTION

1. Field of Invention

The present invention relates to methods of forming an insulating layer and forming a device, and more generally to methods of forming a hydrophobic silicon dioxide ($SiO_2$) layer and forming an organic thin film transistor (OTFT) including the hydrophobic $SiO_2$ layer.

2. Description of Related Art

OTFTs have recently attracted much attention for their applications in radio-frequency identification (RFID) tags, large-area sensors and active matrix flat panel display (AMPD) backplane driving circuits.

Generally, a $SiO_2$ layer is one of the most widely used gate insulating layers in OTFTs. When an OTFT is formed on a flexible substrate, the process temperature of the $SiO_2$ gate insulating layer must be lowered for compatibility, otherwise the flexible substrate may be damaged. However, the $SiO_2$ gate insulating layer formed at low temperature usually includes a significant amount of hydroxyl (OH) groups, which makes the surface of the $SiO_2$ gate insulating layer more polar and hydrophilic. This OH-terminated $SiO_2$ surface may cause poor crystalline growth of an organic semiconductor active layer (e.g. pentacene), and thus the performance of the OTFT is affected.

It is known that the OTFT performance can be greatly improved by modifying the $SiO_2$ surface with a hydrophobic self-assembled monolayer (SAM), such as hexamethyldisilazane (HMDS) or octadecyltrichlorosilane (OTS). HMDS or OTS can form a hydrophobic methyl SAM ($CH_3$-SAM) on the $SiO_2$ surface, so as to reduce the $SiO_2$ surface energy and improve the crystalline growth quality of the organic semiconductor active layer (e.g. pentacene). However, due to the surface modification treatment, the process becomes more complicated and time-consuming and the cost is increased.

SUMMARY OF THE INVENTION

Accordingly, the present invention provides a method of directly forming a hydrophobic $SiO_2$ layer, in which the conventional surface modification treatment is not required, so that the process is simplified and the cost is reduced.

The present invention further provides a method of forming an OTFT, in which a hydrophobic $SiO_2$ gate insulating layer is formed by a simple process to enhance the performance of the device.

The present invention provides a method of forming a hydrophobic silicon dioxide layer. A substrate is provided. A hydrophobic silicon dioxide layer is formed on the substrate by using a plasma chemical vapour deposition (plasma CVD) system, in which tetraethyl orthosilicate (TEOS) and an oxygen-containing gas are introduced at a reaction temperature between 25° C. and 150° C.

According to an embodiment of the present invention, the oxygen-containing gas includes oxygen or ozone.

According to an embodiment of the present invention, the reaction temperature is between 50° C. and 125° C., for example.

According to an embodiment of the present invention, a flow rate ratio of TEOS to the oxygen-containing gas is between 1:3 and 1:5, for example.

According to an embodiment of the present invention, the substrate includes a hard substrate or a flexible substrate.

According to an embodiment of the present invention, the plasma CVD system includes a plasma enhanced CVD (PE CVD) system, a high density plasma CVD (HDP CVD) system, a hollow cathode CVD (HC CVD) system, an electro cyclone resonance CVD (ECR CVD) system or an inductively coupled plasma CVD (ICP CVD) system.

The present invention further provides a method of forming an organic thin film transistor. A substrate is provided. A gate insulating layer is formed on the substrate by using a plasma CVD system, in which TEOS and an oxygen-containing gas are introduced at a reaction temperature between 25° C. and 150° C. A source electrode and a drain electrode are formed on the gate insulating layer beside the substrate. An organic semiconductor active layer is formed on the gate insulating layer and between the source electrode and the drain electrode.

According to an embodiment of the present invention, a flow ratio of TEOS to the oxygen-containing gas is between 1:3 and 1:5, for example.

According to an embodiment of the present invention, the method further includes forming a gate electrode between the substrate and the gate insulating layer after the step of providing the substrate and before the step of forming the gate insulating layer on the substrate.

According to an embodiment of the present invention, the plasma CVD system includes a PE CVD system, an HDP CVD system, an HC CVD system, an ECR CVD system or an ICP CVD system.

In view of the above, in the present invention, a hydrophobic $SiO_2$ gate insulating layer of an OTFT can be formed at low temperature. This hydrophobic $SiO_2$ surface favours the crystalline growth of an organic semiconductor active layer with a larger grain size, and thus, the performance of the device is greatly improved. In addition, the hydrophobic $SiO_2$ layer can be directly formed at low temperature without using the conventional surface modification treatment. Accordingly, the process is simplified and the cost is reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
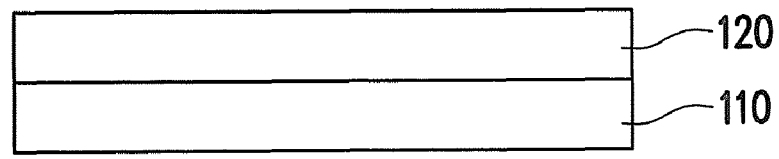
FIGS. 1A to 1C schematically illustrate cross-sectional views of a method of fanning an OTFT according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1B:
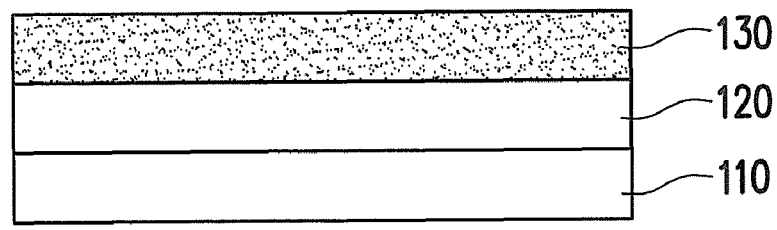
Figure 1C:
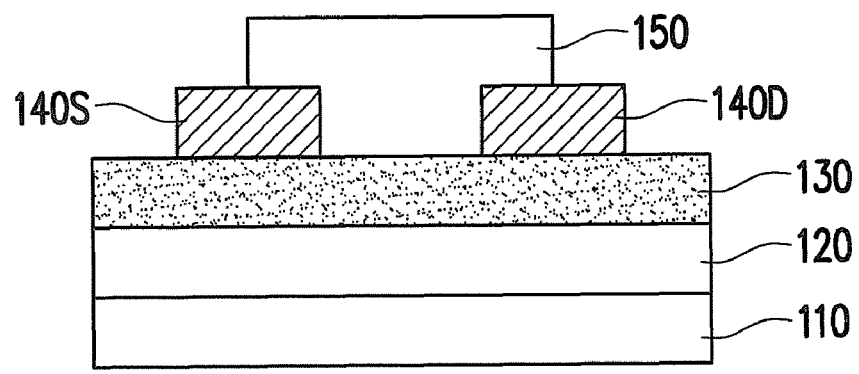

FIGS. 1A to 1C schematically illustrate cross-sectional views of a method of forming an OTFT according to a first embodiment of the present invention.

Referring to FIG. 1A, a substrate 110 is provided. The substrate 110 can be a hard substrate (e.g. a glass substrate, a quartz substrate or a silicon substrate) or a flexible substrate (e.g. a plastic substrate or a metal thin film).

Thereafter, a gate electrode 120 is formed on the substrate 110. The material of the gate electrode 120 includes Ag, Au, Cu, Al or an alloy thereof. The gate electrode 120 is formed by performing a physical vapour deposition (PVD) process or a thermal evaporation process.

Referring to FIG. 1B, a gate insulating layer 130 is formed on the gate electrode 120. The gate insulating layer 130 is formed by performing a plasma CVD process system, in which tetraethyl orthosilicate (TEOS) and an oxygen-containing gas are introduced at a low reaction temperature, so as to form a hydrophobic $SiO_2$ layer on the gate electrode 120. The oxygen-containing gas includes oxygen or ozone.

The reaction temperature is between 25° C. (room temperature) and 150° C., for example. In an embodiment, the reaction temperature is between 50° C. and 125° C. In another embodiment, the reaction temperature is between 60° C. and 100° C. In yet another embodiment, the reaction temperature is between 70° C. and 90° C.

In addition, the flow rate ratio of TEOS to the oxygen-containing gas is between 1:3 and 1:5, for example. For example, the flow rate of TEOS is about 50-80 sccm, and the flow rate of the oxygen-containing gas is about 150-400 sccm. Besides, the radio frequency (RF) power is about 300-500 W, and the pressure is about 10-50 mtorr.

The plasma CVD system may include, but not limited to, a plasma enhanced CVD (PE CVD) system, a high density plasma CVD (HDP CVD) system, a hollow cathode CVD (HC CVD) system, an electro cyclone resonance CVD (ECR CVD) system or an inductively coupled plasma CVD (ICP CVD) system.

Referring to FIG. 1C, a source electrode 140S and a drain electrode 140D are formed on the gate insulating layer 130 beside the gate electrode 120. The material of the source electrode 140S and the drain electrode 140D includes Ag, Au, Cu, Al, Pt, Cr or an alloy thereof. The method of forming the source electrode 140S and the drain electrode 140D includes foaming a metal layer by a PVD process or a thermal evaporation process, and then patterning the metal layer by a lift-off process.

Thereafter, an organic semiconductor active layer 150 is formed on the gate insulating layer 130 and between the source electrode 140S and the drain electrode 140D. The material of the organic semiconductor active layer 150 includes organic small molecules, organic polymers, or organic/inorganic mixture layers, such as pentacene. The organic semiconductor active layer 150 is formed by performing a thermal evaporation process, a vacuum evaporation process, a spin coating process or an inkjet printing process, for example. The OTFT of the first embodiment is thus completed.

It is noted that in the present invention, the reaction temperature is lower, so that residual hydrophobic methyl ($CH_3$) groups are generated due to incomplete decomposition of TEOS in a low temperature environment. The hydrophobic methyl groups are simultaneously deposited during the process of forming the $SiO_2$ layer, and thus, the surface of the resulting $SiO_2$ layer exhibits a hydrophobic character.

This hydrophobic $SiO_2$ layer (i.e. the gate insulating layer 130) favours the crystalline growth of the organic semiconductor active layer 150. In details, since the material used for the organic semiconductor active layer usually exhibits a hydrophobic character, the organic semiconductor active layer is required to growth on a substrate having the same surface property (e.g. hydrophobicity) so as to enhance the crystallinity of the organic semiconductor active layer and simultaneously form a larger grain size. Accordingly, the performance of the device is improved.

Second Embodiment

Figure 2A:
FIGS. 2A to 2B schematically illustrate cross-sectional views of a method of forming an OTFT according to a second embodiment of the present invention.
Figure 2B:
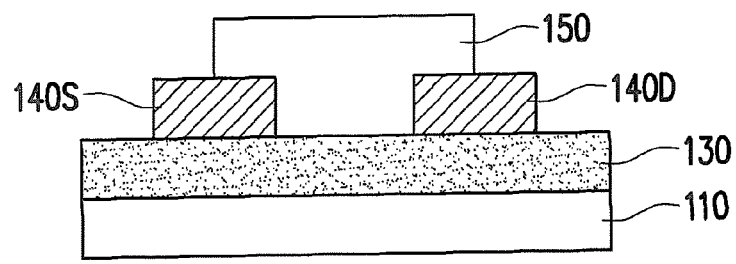

FIGS. 2A to 2B schematically illustrate cross-sectional views of a method of forming an OTFT according to a second embodiment of the present invention. The second embodiment is similar to the first embodiment. The differences between them are described in detail hereafter, while similarities thereof are omitted.

Referring to FIG. 2A, a substrate 110 is provided. It is noted that when the substrate 110 is a heavily doped silicon substrate, it can serve as a gate electrode. In this case, the step of forming the gate electrode can be omitted, and a gate insulating layer 130 can be directly formed on the substrate 110. The gate insulating layer 130 is a hydrophobic $SiO_2$ layer, the forming method thereof has been described in the first embodiment, and the details are not iterated herein.

Referring to FIG. 2B, a source electrode 1405 and a drain electrode 140D are formed on the gate insulating layer 130 beside the substrate 110. Thereafter, an organic semiconductor active layer 150 is formed on the gate insulating layer 130 and between the source electrode 140S and the drain electrode 140D. The materials and forming methods of the source electrode 140S, the drain electrode 140D and the organic semiconductor active layer 150 have been described in the first embodiment, and the details are not iterated herein. The OTFT of the second embodiment is thus completed.

The above embodiments in which the hydrophobic $SiO_2$ layer serves as a gate insulating layer in an OTFT are provided for illustration purposes, and are not construed as limiting the present invention. It is appreciated by persons skilled in the art that the hydrophobic $SiO_2$ layer can be applied to any member or device including a hydrophobic insulating layer. For example, the hydrophobic $SiO_2$ layer can serve as a protection layer upon the requirement.

Several examples and comparative examples are numerated below to prove the performance of the present invention. Since the $SiO_2$ gate insulating layer foamed through a thermal oxidation process exhibits excellent desired characteristics and is regarded as a golden sample, it is compared with the hydrophobic $SiO_2$ layer formed through a low temperature plasma CVD process in the following.

Example 1

An N-type heavily doped silicon substrate is provided. Thereafter, a plasma CVD process in which TEOS and oxygen are introduced at 80° C. is used to form a hydrophobic SiO$_2$ layer as a gate insulating layer on the silicon substrate. The TEOS flow rate is 65 sccm, and the oxygen flow rate is 200 sccm. Besides, the RF power is 300 W, and the pressure is 50 mtorr. The hydrophobic SiO$_2$ layer has a thickness of 100 nm.

Comparative Example 1

An N-type heavily doped silicon substrate is provided. Thereafter, a SiO$_2$ layer as a gate insulating layer is formed on the silicon substrate by a thermal oxidation process at 980° C. The SiO$_2$ layer has a thickness of 100 nm.

Example 2

The N-type heavily doped silicon substrate with the hydrophobic SiO$_2$ layer thereon of Example 1 is provided. Thereafter, a pentacene layer of 50 nm thick is formed on the surface of the hydrophobic SiO$_2$ layer.

Comparative Example 2

The N-type heavily doped silicon substrate with the hydrophilic SiO$_2$ layer thereon of Comparative Example 1 is provided. Thereafter, a pentacene layer of 50 nm thick is formed on the surface of the hydrophilic SiO$_2$ layer.

Figure 3:
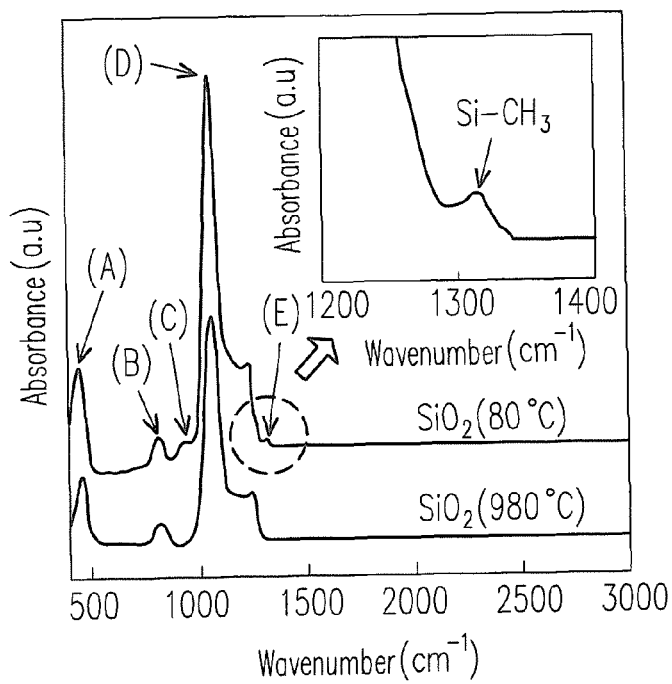
FIG. 3 illustrates the comparison of Fourier transform infrared (FTIR) spectra between Example 1 and Comparative Example 1.

FIG. 3 illustrates the comparison of Fourier transform infrared (FTIR) spectra between Example 1 and Comparative Example 1, wherein peak (A) presents Si—O—Si rocking, peak (B) presents Si—O—Si bending, peak (C) presents Si—OH stretching, peak (D) presents Si—O—Si stretching, and peak (E) presents Si—CH$_3$ bending. Table 1 shows the testing results of Examples 1-2 and Comparative Examples 1-2.

TABLE 1

| | Water contact angle | Surface energy (mJ/m$^2$) | Si—CH$_3$ bending | Surface property | Surface roughness R$_{rms}$ (nm) | Pentacene grain size (μm) |
|---|---|---|---|---|---|---|
| Example 1 | 51.48° | 47.93 | Yes | hydrophobicity | 0.315 | — |
| Comparative Example 1 | 31.81° | 62.28 | No | hydrophilicity | 0.216 | — |
| Example 2 | — | — | — | — | — | 4.6 |
| Comparative Example 2 | — | — | — | — | — | ~2.5 |

As shown in FIG. 3, as compared with the SiO$_2$ layer of Comparative Example 1, Si—CH$_3$ bending (i.e. peak (E)) is obviously present in the SiO$_2$ layer of Example 1. That is, the SiO$_2$ layer of Example 1 has Si—CH$_3$ hydrophobic groups so as to exhibit surface hydrophobicity. In addition, Table 1 shows that the SiO$_2$ layer of Example 1 exhibits a hydrophobic character while the SiO$_2$ layer of Comparative Example 1 exhibits a hydrophilic character, so that the SiO$_2$ layer of Example 1 has a higher water contact angle than that of Comparative Example 1.

Besides, the surface energy can be estimated from the water contact angle by Girifalco-Good-Fowkes-Young (GGFY) model. The surface energy of the pentacene layer is about 38-48 mJ/m$^2$. Table 1 shows that the surface energy in Example 1 (47.93 mJ/m$^2$) is closer to that of the pentacene layer as compared with that in Comparative Example 1 (62.28 mJ/m$^2$). The surface energy is one of the main factors known to affect the crystalline growth of the pentacene layer. Since the SiO$_2$ layer of the present invention has a similar surface energy with the pentacene layer and exhibits surface hydrophobicity, the crystalline growth quality of the pentacene layer is greatly improved. As shown in Table 1, the pentacene layer of Example 2 has a larger grain size than that of Comparative Example 2. In the channel region of an OTFT, larger pentacene grains can significantly reduce the number of grain boundaries. The grain boundaries act as potential trap sites so as to impede the carrier movement. Therefore, the less the number of grain boundaries, the higher the device performance.

Example 3

The N-type heavily doped silicon substrate with the hydrophobic SiO$_2$ layer thereon of Example 1 is provided. Thereafter, a Cr/Pt alloy serving as a source electrode and a drain electrode is formed on the hydrophobic SiO$_2$ layer by a thermal evaporation system. The Cr/Pt alloy has a thickness of 2 nm/70 nm. A lift-off process is then performed to pattern the Cr/Pt alloy, so as to form the source electrode and the drain electrode on the hydrophobic SiO$_2$ layer beside the silicon substrate. Afterwards, a pentacene layer as an organic semiconductor active layer is formed on the hydrophobic SiO$_2$ layer and between the source electrode and the drain electrode by a thermal evaporation system with the substrate temperature maintained at room temperature (25° C.). The pentacene layer has a thickness (i.e. channel thickness) of 50 nm. In addition, the channel width and length of the OTFT are 500 μm and 10 μm respectively.

Comparative Example 3

The N-type heavily doped silicon substrate with the hydrophilic SiO$_2$ layer thereon of Comparative Example 1 is provided. Thereafter, the Cr/Pt alloy as the source electrode and the drain electrode and the pentacene layer are formed in accordance with the same procedure as in Example 3.

Table 2 shows the electrical testing results of Example 3 and Comparative Example 3. An HP 4145B semiconductor parameter analyzer is used to perform the testing in a dark environment, wherein the electrical parameters include threshold voltage (V$_{TH}$), field effect mobility (μ$_{FE}$), subthreshold swing (SS) and on/off current ratio (I$_{ON}$/I$_{OFF}$).

TABLE 2

| | Example 3 | Comparative Example 3 |
|---|---|---|
| Deposition temperature of SiO$_2$ layer (° C.) | 80 | 980 |
| Thickness of SiO$_2$ layer (nm) | 100 | 100 |
| Channel thickness (nm) | 50 | 50 |
| V$_{TH}$ (V) | −3 | −5 |
| μ$_{FE}$ (cm$^2$/V s) | 2.3 × 10$^{-2}$ | 3.7 × 10$^{-2}$ |
| SS (V/decade) | 0.6 | 1.01 |
| I$_{ON}$/I$_{OFF}$ | 1.27 × 10$^5$ | 1 × 10$^6$ |

Referring to Table 2, the OTFT including the hydrophobic SiO$_2$ layer as a gate insulating layer (Example 3) has comparable electrical performance with that including the hydrophilic SiO$_2$ layer as a gate insulating layer (Comparative Example 3). Specifically, Example 3 and Comparative Example 3 provide similar μ$_{FE}$ and V$_{TH}$. Moreover, Example 3 provides a lower SS than Comparative Example 3 so as to achieve a better electrical performance.

It is noted that the hydrophobic SiO$_2$ layer of the present invention is fabricated in a low temperature environment, without using a high temperature apparatus or performing a conventional surface modification treatment. Accordingly, the method in accordance with the present invention is very competitive.

In summary, in the present invention, a SiO$_2$ layer with surface hydrophobicity is formed by using a plasma CVD system, in which TEOS and an oxygen-containing gas are introduced at low temperature. This SiO$_2$ layer with surface hydrophobicity can be used as a gate insulating layer of an OTFT device.

The hydrophobic SiO$_2$ layer of the present invention has similar surface properties (e.g. hydrophobicity, surface energy, etc.) with the organic semiconductor active layer, so as to favour the crystalline growth of the organic semiconductor active layer with a larger grain size, thereby greatly improving the performance of the device. In the present invention, the hydrophobic SiO$_2$ layer can be directly formed at low temperature without using the conventional surface modification treatment. Accordingly, the process is simplified and the cost is reduced. Further, the hydrophobic SiO$_2$ layer of the present invention is fabricated at low temperature, so that a flexible substrate is not damaged from the low process temperature. Therefore, the hydrophobic SiO$_2$ layer of the present invention can be widely applied in flexible products.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a hydrophobic silicon dioxide layer, comprising:
   providing a substrate; and
   forming a hydrophobic silicon dioxide layer on the substrate by using a plasma chemical vapour deposition (plasma CVD) system, in which tetraethyl orthosilicate (TEOS) and an oxygen-containing gas are introduced at a reaction temperature between 25° C. and 150° C.,
   wherein a radio frequency power of the plasma CVD system is 300-500 W, and
   wherein the hydrophobic silicon dioxide layer has a Si—CH$_3$ hydrophobic group.

2. A method of forming an organic thin film transistor, comprising:
   providing a substrate;
   forming a gate insulating layer on the substrate by using a plasma chemical vapour deposition (plasma CVD) system, in which tetraethyl orthosilicate (TEOS) and an oxygen-containing gas are introduced at a reaction temperature between 25° C. and 150° C.;
   forming a source electrode and a drain electrode on the gate insulating layer beside the substrate; and
   forming an organic semiconductor active layer on the gate insulating layer and between the source electrode and the drain electrode,
   wherein a radio frequency power of the plasma CVD system is 300-500 W, and
   wherein the gate insulating layer has a Si—CH$_3$ hydrophobic group.

3. The method of claim 1, wherein the oxygen-containing gas comprises oxygen or ozone.

4. The method of claim 1, wherein the reaction temperature is between 50° C. and 125° C.

5. The method of claim 1, wherein a flow rate ratio of TEOS to the oxygen-containing gas is between 1:3 and 1:5.

6. The method of claim 1, wherein the substrate comprises a hard substrate or a flexible substrate.

7. The method of claim 1, wherein the plasma CVD system comprises a plasma enhanced CVD (PE CVD) system, a high density plasma CVD (HDP CVD) system, a hollow cathode CVD (HC CVD) system, an electro cyclone resonance CVD (ECR CVD) system or an inductively coupled plasma CVD (ICP CVD) system.

8. The method of claim 2, wherein a flow ratio of TEOS to the oxygen-containing gas is between 1:3 and 1:5.

9. The method of claim 2, further comprising forming a gate electrode between the substrate and the gate insulating layer after the step of providing the substrate and before the step of forming the gate insulating layer on the substrate.

10. The method of claim 2, wherein the plasma CVD system comprises a plasma enhanced CVD (PE CVD) system, a high density plasma CVD (HDP CVD) system, a hollow cathode CVD (HC CVD) system, an electro cyclone resonance CVD (ECR CVD) system or an inductively coupled plasma CVD (ICP CVD) system.

* * * * *